(12) United States Patent
Gruber et al.

(10) Patent No.: US 10,727,107 B2
(45) Date of Patent: Jul. 28, 2020

(54) SEMICONDUCTOR DEVICES AND METHODS FOR FORMING SEMICONDUCTOR DEVICES

(71) Applicant: Infineon Technologies Austria AG, Villach (AT)

(72) Inventors: Hermann Gruber, Woerth a. D. (DE); Markus Muellauer, Faak am See (AT); Matthias Stecher, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/881,411

(22) Filed: Jan. 26, 2018

(65) Prior Publication Data

US 2018/0218939 A1    Aug. 2, 2018

(30) Foreign Application Priority Data

Jan. 27, 2017 (DE) .................. 10 2017 101 662

(51) Int. Cl.
*H01L 21/762* (2006.01)
*H01L 23/522* (2006.01)
*H01L 23/528* (2006.01)

(52) U.S. Cl.
CPC ...... *H01L 21/76264* (2013.01); *H01L 23/528* (2013.01); *H01L 23/5226* (2013.01); *H01L 23/5227* (2013.01); *H01L 23/5228* (2013.01); *H01L 21/76283* (2013.01)

(58) Field of Classification Search
CPC ........ H01L 21/76–765; H01C 1/00–16; H01C 3/00–20; H01C 7/00–22; H01C 8/00–04; H01C 10/00–50; H01C 13/00–02; H01C 17/12
See application file for complete search history.

(56) References Cited

U.S. PATENT DOCUMENTS 6,104,054 A * 8/2000 Corsi ................ H01L 21/76264
257/301
2006/0211264 A1  9/2006 Kakoschke et al.
2008/0012142 A1  1/2008 Mehta et al.
2012/0049902 A1  3/2012 Corona et al.
(Continued)

FOREIGN PATENT DOCUMENTS

DE   112004002608 T5   11/2006
EP       0067475 A2   12/1982
JP       S6094757 A    5/1985

*Primary Examiner* — Eric A. Ward
(74) *Attorney, Agent, or Firm* — Murphy, Bilak & Homiller, PLLC

(57) ABSTRACT

A semiconductor device includes a semiconductor substrate having a first region and a second region. The semiconductor device also includes an insulating structure laterally between the first region and the second region in the semiconductor substrate. The insulating structure electrically insulates the first region laterally from the second region in the semiconductor substrate. The semiconductor device further includes a connecting structure at a surface of the semiconductor substrate. The connecting structure contacts at least a sub-structure of the insulating structure and at least one of the first region and the second region. At least a sub-structure of the connecting structure has an electrical resistivity greater than $1*10^3$ $\Omega$m and less than $1*10^{12}$ $\Omega$m.

21 Claims, 8 Drawing Sheets

(56) References Cited

U.S. PATENT DOCUMENTS

| | | |
|---|---|---|
| 2012/0217574 A1 | 6/2012 | Kumano |
| 2013/0009272 A1 | 1/2013 | Sakurai et al. |
| 2013/0320485 A1* | 12/2013 | Ching Tee .......... H01L 29/7394 257/507 |
| 2015/0294898 A1* | 10/2015 | Yamaguchi ....... H01L 21/76224 257/506 |
| 2016/0104678 A1 | 4/2016 | Jun et al. |
| 2016/0285418 A1 | 9/2016 | Jones et al. |

\* cited by examiner

SEMICONDUCTOR DEVICES AND METHODS FOR FORMING SEMICONDUCTOR DEVICES

BACKGROUND

A semiconductor device may include a semiconductor substrate having several regions electrically insulated from one another. There may be a desire to improve the electrical insulation of the regions.

SUMMARY

There may be a demand to provide concepts for semiconductor devices with improved electrical insulation.

Some embodiments relate to a semiconductor device. The semiconductor device comprises a semiconductor substrate comprising a first region and a second region. Additionally, the semiconductor device comprises an insulating structure located laterally between the first region and the second region in the semiconductor substrate. The insulating structure electrically insulates the first region laterally from the second region in the semiconductor substrate. The semiconductor device further comprises a connecting structure located at a surface of the semiconductor substrate. The connecting structure is in contact with at least a sub-structure of the insulating structure and with at least one of the first region and the second region. Additionally, at least a sub-structure of the connecting structure has an electrical resistivity greater than $1*10^3$ $\Omega$m and less than $1*10^{12}$ $\Omega$m.

Some embodiments relate to a method for forming a semiconductor device. The method comprises forming an insulating structure located laterally between a first region and a second region of a semiconductor substrate in the semiconductor substrate. The insulating structure electrically insulates the first region laterally from the second region in the semiconductor substrate. Additionally, the method comprises forming a connecting structure located at a surface of the semiconductor substrate. The connecting structure is in contact with at least a sub-structure of the insulating structure and with at least one of the first region and the second region. Further, at least a sub-structure of the connecting structure has an electrical resistivity greater than $1*10^3$ $\Omega$m and less than $1*10^{12}$ $\Omega$m.

Those skilled in the art will recognize additional features and advantages upon reading the following detailed description, and upon viewing the accompanying drawings.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
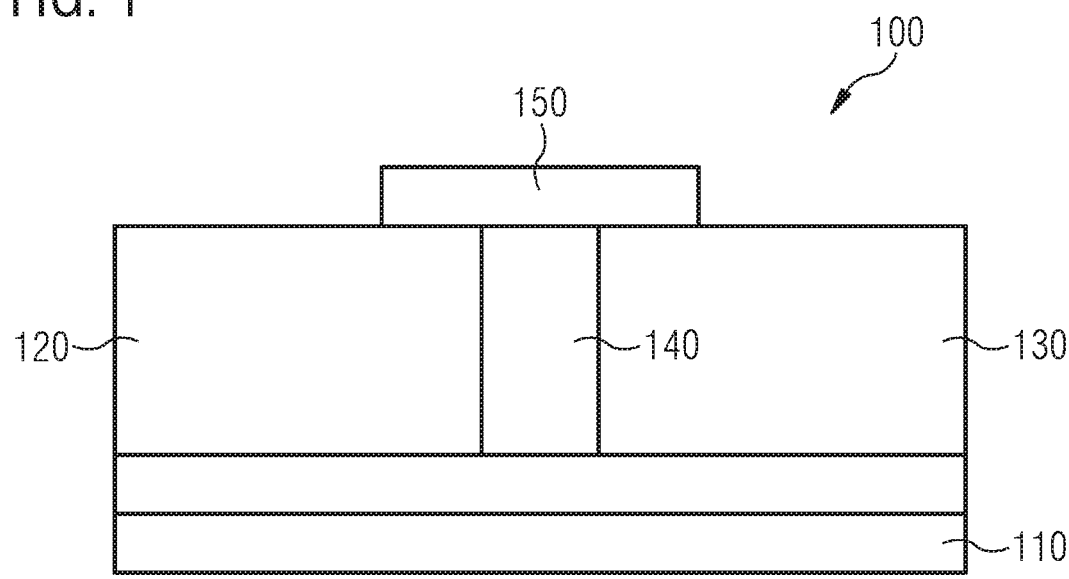
FIG. 1 shows a schematic cross section of a part of a semiconductor device.

FIG. 1 shows a schematic cross section of a part of a semiconductor device 100. The semiconductor device 100 comprises a semiconductor substrate 110 comprising a first region 120 and a second region 130. Additionally, the semiconductor device 100 comprises an insulating structure 140 located laterally between the first region 120 and the second region 130 in the semiconductor substrate 110. The insulating structure 140 electrically insulates the first region 120 laterally from the second region 130 in the semiconductor substrate 110. The semiconductor device 100 further comprises a connecting structure 150 located at a surface of the semiconductor substrate 110. The connecting structure 150 is in contact with at least a sub-structure of the insulating structure 140 and with at least one of the first region 120 and the second region 130. Further, at least a substructure of the connecting structure 150 has an electrical resistivity greater than $1*10^3$ Ωm (or greater than $1*10^4$ Ωm, greater than $1*10^5$ Ωm, or greater than $1*10^6$ Ωm) and less than $1*10^{12}$ Ωm (or less than $1*10^{11}$ Ωm, less than $1*10^{10}$ Ωm, less than $1*10^9$ Ωm, or less than $1*10^8$ Ωm).

The first region 120 and the second region 130 may be at different potentials during an operation of the semiconductor device 100. By electrically connecting at least the substructure of the insulating structure 140 to at least one of the first region 120 and the second region 130 via the connecting structure 150, a potential of the insulating structure 140 may be efficiently controlled. In this way, a potential difference between the insulating structure 140 and the first region 120 and/or a potential difference between the insulating structure 140 and the second region 130 may be efficiently controlled. By this, a lateral breakdown voltage of the insulating structure 140 may be increased. In this way, a lateral electrical insulation of the first region 120 from the second region 130 and thereby an electrical insulation of the semiconductor device 100 may be improved.

For example, the connecting structure 150 may be formed by a single structure or element having an electrical resistivity greater than $1*10^3$ Ωm (or greater than $1*10^4$ Ωm, greater than $1*10^5$ m, or greater than $1*10^6$ Ωm) and less than $1*10^{12}$ Ωm (or less than $1*10^{11}$ Ωm, less than $1*10^{10}$ Ωm, less than $1*10^9$ Ωm, or less than $1*10^8$ Ωm). Alternatively, the connecting structure 150 may comprise a plurality of sub-structures (e.g. of layers or elements comprising different materials), wherein at least one of the sub-structures has an electrical resistivity greater than $1*10^3$ Ωm (or greater than $1*10^4$ Ωm, greater than $1*10^5$ Ωm, or greater than $1*10^6$ Ωm) and less than $1*10^{12}$ Ωm (or less than $1*10^{11}$ Ωm, less than $1*10^{10}$ Ωm, less than $1*10^9$ Ωm, or less than $1*10^8$ Ωm).

For example, the sub-structure of the connecting structure 150 may be located adjacent to (and thereby in contact with) the sub-structure of the insulating structure 140 and adjacent to (and thereby in contact with) at least one of the first region 120 and the second region 130. Alternatively, the connecting structure 150 may comprise an electrically conducting portion located between the sub-structure of the connecting structure 150 and the sub-structure of the insulating structure 140 and/or at least one of the first region 120 and the second region 130. For example, the electrically conducting portion of the connecting structure 150 may comprise a first via extending (e.g. through an insulating layer located at the surface of the semiconductor substrate 110) from the sub-structure of the connecting structure 150 to the sub-structure of the insulating structure 140, a second via extending (e.g. through the insulating layer located at the surface of the semiconductor substrate 110) from the sub-structure of the connecting structure 150 to the first region 120, and/or a third via extending (e.g. through the insulating layer located at the surface of the semiconductor substrate 110) from the sub-structure of the connecting structure 150 to the second region 130. An electrical resistivity of the electrically conducting portion of the connecting structure 150 may be less than the electrical resistivity of the sub-structure of the connection structure 150, for example. For example, the electrically conducting portion of the connecting structure 150 may comprise aluminum, copper, tungsten and/or poly silicon and/or an alloy of aluminum, copper, tungsten and/or poly silicon.

For example, the connecting structure 150 may comprise solely material having an electrical resistivity of less than $1*10^{12}$ Ωm (or less than $1*10^{11}$ Ωm, less than $1*10^{10}$ Ωm, less than $1*10^9$ Ωm, or less than $1*10^8$ Ωm). In this way, an electrical current through the connecting structure 150 may be reduced. By this, the electrical insulation of the first region 120 from the second region 130 and thereby the electrical insulation of the semiconductor device 100 may be improved.

For example, the connecting structure 150 may comprise a high ohmic but not (completely) electrically insulating material. The high ohmic but not (completely) electrically insulating material may be connected to at least the sub-structure of the insulating structure 140. Thereby, the potential of the whole insulating structure 140 may be fixed.

For example, the first region 120 of the semiconductor substrate 110 may be a semiconductor material region of the semiconductor substrate 110 for implementing electrical element structures (e.g. transistors and/or diodes) in a first voltage domain. The second region 130 of the semiconductor substrate 110 may be a semiconductor material region of the semiconductor substrate 110 for implementing electrical element structures (e.g. transistors and/or diodes) in a second voltage domain, for example.

For example, the insulating structure 140 may laterally separate the first region 120 from the second region 130. The insulating structure 140 may extend vertically from the surface of the semiconductor substrate 110 into the semiconductor substrate 110, for example. For example, the insulating structure 140 may comprise an electrically insulating material having an electrical resistivity greater than (e.g. greater than 200% of, greater than 500% of, or greater than 1000% of) the electrical resistivity of the connecting structure 150 or of the sub-structure of the connecting structure 150. The insulating structure 140 may comprise silicon oxide ($SiO_2$), for example. For example, the surface of the semiconductor substrate 110 may be a front side surface of the semiconductor substrate 110.

For example, at least the sub-structure of the connecting structure 150 may be at least one of a metal oxide structure, a metal nitride structure, a diamond structure, a diamond like structure, a diamond like carbon structure, a silicon carbide structure, a silicon carbide like structure, a hydrogenated silicon carbide structure, a silicon oxide structure, and a silicon nitride structure. The metal oxide structure, the metal nitride structure, the diamond structure, the diamond like structure, the diamond like carbon structure, the silicon carbide structure, the silicon carbide like structure, the hydrogenated silicon carbide structure, the silicon oxide structure, or the silicon nitride structure may be formed by depositing a metal oxide layer, a metal nitride layer, a diamond layer, a diamond like layer, a diamond like carbon (DLC) layer, a silicon carbide layer, a silicon carbide like layer, a hydrogenated silicon carbide layer, a silicon oxide layer, or a silicon nitride layer at the surface of the semiconductor substrate 110 and by structuring the deposited metal oxide layer, the deposited metal nitride layer, the deposited diamond layer, the deposited diamond like layer, the deposited diamond like carbon (DLC) layer, the deposited silicon carbide layer, the deposited silicon carbide like layer, the deposited hydrogenated silicon carbide layer, the deposited silicon oxide layer, or the deposited silicon nitride layer, for example. For example, the connecting structure 150 may be at least one of a metal oxide structure, a metal nitride structure, a diamond structure, a diamond like structure, a diamond like carbon structure, a silicon carbide structure, a silicon carbide like structure, a hydrogenated silicon carbide structure, a silicon oxide structure, and a silicon nitride structure. The metal oxide structure, the metal nitride structure, the diamond structure, the diamond like structure, the diamond like carbon structure, the silicon carbide structure, the silicon carbide like structure, the hydrogenated silicon carbide structure, the silicon oxide structure, or the silicon nitride structure may be a doped (e.g. p-doped or n-doped) structure, an undoped structure, a hydrogen treated structure, or a nitrogen treated structure, for example.

For example, the connecting structure 150 may be in contact with the first region 120 of the semiconductor substrate 110 and the second region 130 of the semiconductor substrate 110. In this way, the potential difference between the sub-structure of the insulating structure 140 and the first region 120 and the potential difference between the sub-structure of the insulating structure 140 and the second region 130 may be efficiently controlled. By this, the lateral breakdown voltage of the insulating structure 140 may be increased. In this way, the electrical insulation of the first region 120 from the second region 130 and thereby the electrical insulation of the semiconductor device 100 may be improved. For example, the sub-structure of the connecting structure 150 may be located adjacent to the portion of the insulating structure 140, adjacent to the first region 120 and adjacent to the second region 130. Alternatively, the electrically conducting portion (e.g. the vias) of the connecting structure 150 may be located adjacent to the portion of the insulating structure 140, adjacent to the first region 120 and adjacent to the second region 130.

Alternatively, the semiconductor device 100 may comprise a first connecting structure 150 in contact with the first region 120 and the sub-structure of the insulating structure 140 and a second connecting structure 150 in contact with the second region 130 and the sub-structure of the insulating structure 140.

For example, the connecting structure 150 may be a (leaky dielectric) layer formed directly at the surface of the semiconductor substrate 110. In this way, the connecting structure 150 may be formed more cost efficiently. For example, the (leaky dielectric) layer may extend laterally from the first region 120 of the semiconductor substrate 110 to the insulating structure 140 or from the insulating structure 140 to the second region 130 of the semiconductor substrate 110. Alternatively, the (leaky dielectric) layer may extend laterally from the first region 120 of the semiconductor substrate 110 via the insulating structure 140 to the second region 130 of the semiconductor substrate 110.

For example, the sub-structure of the insulating structure 140 may be implemented by an intermediate potential region comprising at least one of an electrical conducting material and a semiconductor material. In this way, the potential of the insulating structure 140 may be more efficiently controlled. For example, the at least one intermediate potential region may be at a potential lying between a potential of the first region 120 and a potential of the second region 130 during an operation of the semiconductor device 100. The at least one intermediate potential region may comprise aluminum, copper, tungsten, poly silicon, silicon, silicon carbide, gallium arsenide and/or gallium nitride, for example.

For example, the insulating structure 140 may comprise a first trench extending from the surface of the semiconductor substrate 110 into the semiconductor substrate 110. The sub-structure of the insulating structure 140 may comprise an intermediate potential region located within the first trench. Further, insulating material may be arranged between a wall of the first trench and the intermediate potential region. Additionally, the intermediate potential region may be in contact with the sub-structure of the connecting structure 150. In this way, the insulating structure 140 may be cost efficiently provided. For example, the insulating material may be silicon oxide. The intermediate potential region may be formed by depositing electrically conducting material (e.g. aluminum, copper, tungsten, or poly silicon) within the first trench, for example. For example, the insulating material may electrically insulate the intermediate potential region located within the first trench from semiconductor material within the first trench.

For example, the insulating structure may comprise a first trench and a second trench extending from the surface of the semiconductor substrate 110 into the semiconductor substrate 110. The first trench and the second trench may each be at least partially filled with an insulating material. Additionally, the first trench may electrically insulate a third region of the semiconductor substrate 110 laterally from the first region 120 of the semiconductor substrate 110. Further, the second trench may electrically insulate the third region of the semiconductor substrate 110 laterally from the second region 130 of the semiconductor substrate 110. Additionally, the sub-structure of the insulating structure 140 may be implemented by the third region of the semiconductor substrate 110. In this way, the insulating structure 140 may be more cost efficiently provided by utilizing an already existing trench (e.g. the second trench). For example, the insulating material may be silicon oxide. For example, the third region of the semiconductor substrate 110 may be a semiconductor material region of the semiconductor substrate 110.

For example, intermediate potential regions may be formed within the first trench and the second trench. The intermediate potential regions may be formed by depositing electrically conducting material (e.g. aluminum, copper, tungsten, or poly silicon) within the first trench and the second trench, for example. For example, the insulating material may electrically insulate the intermediate potential region formed within the first trench or the second trench from semiconductor material within the first trench or the second trench. The intermediate potential regions located within the first trench and the second trench may be in contact with the connecting structure 150, for example.

For example, the semiconductor device 100 may further comprise a dielectric structure located adjacent to the connecting structure 150 and electrically insulating the connecting structure 150 from other wiring structures of the semiconductor device 100. The electrical resistivity of the sub-structure of the connecting structure 150 may be less than 10% (or less than 1% or less than 0.1%) of an electrical resistivity of the dielectric structure. For example, the dielectric structure may be implemented by one or more dielectric layers, e.g. of a wiring layer stack of the semiconductor device 100. For example, the dielectric structure may be formed from at least one of silicon oxide and borophosphosilicate glass (BPSG). The dielectric structure may be formed by depositing a silicon oxide layer and/or a borophosphosilicate glass layer at the surface of the semiconductor substrate 110 and at a surface of the connecting structure 150, for example.

For example, the semiconductor device may further comprise a buried insulation layer located within the semiconductor substrate 110. The buried insulation layer may electrically insulate at least one of the first region 120 and the second region 130 vertically from a bulk of the semiconductor substrate 110. In this way, the electrical insulation of the first region 120 from the second region 130 may be improved. For example, the buried insulation layer may be embedded in the semiconductor substrate 110. The buried insulation layer may be located adjacent to the first region 120, the second region 130 and/or the insulating structure 140, for example. For example, a vertical distance from the buried insulation layer to the surface of the semiconductor substrate 110 (e.g. to the front side surface of the semiconductor substrate 110) may be greater than 1 μm (or greater than 10 μm or greater than 100 μm). A vertical distance from the buried insulation layer to a back side surface of the semiconductor substrate 110 may be greater than 1 μm (or greater than 10 μm or greater than 100 μm), for example.

Alternatively, the semiconductor device may further comprise a back side insulation layer located at a back side of the semiconductor substrate 110. For example, a lateral dimension (e.g. a maximum lateral dimension) of the buried insulation layer may be equal to or greater than 95% of a lateral dimension (e.g. a maximum lateral dimension) of the semiconductor substrate 110.

For example, the buried insulation layer or the back side insulation layer may comprise at least one of silicon oxide and aluminum nitride.

For example, the insulating structure 140 may vertically extend from the surface of the semiconductor substrate 110 to the buried insulation layer or to the back side insulation layer. In this way, the electrical insulation of the first region 120 from the second region 130 may be further improved.

For example, the insulating structure 140 may laterally surround the first region 120 of the semiconductor substrate 110. In this way, the first region 120 may be formed at any point within the semiconductor substrate 110. For example, the first trench and/or the second trench may laterally surround the first region 120 of the semiconductor substrate 110. The first region 120 of the semiconductor substrate 110 and/or the insulating structure 140 may laterally have a ring shape or a rectangular shape, for example. For example, the second region 130 of the semiconductor substrate 110 may laterally surround the first region 120 of the semiconductor substrate 110. The second region 130 of the semiconductor substrate 110 may laterally surround the insulating structure 140, for example.

For example, the semiconductor substrate 110 may be a semiconductor on insulator substrate. For example, the semiconductor material of the semiconductor on insulator substrate may be silicon (Si), silicon carbide (SiC), gallium arsenide (GaAS), or gallium nitride (GaN). The semiconductor substrate 110 may be a silicon on insulator (SOI) substrate, for example. Alternatively, the semiconductor material of the semiconductor substrate 110 may be a silicon based substrate, a silicon carbide based substrate, a gallium arsenide based substrate, or a gallium nitride based substrate. For example, the semiconductor substrate 110 may be a semiconductor wafer or a semiconductor die.

For example, a first electrical element structure may be located at least partially within the first region 120 of the semiconductor substrate 110. A second electrical element structure may be located at least partially within the second region 130 of the semiconductor substrate 110. Further, the first electrical element structure and the second electrical element structure may be connected via a giant magnetoresistance coupler structure. For example, the first electrical element structure may be a transistor structure (e.g. a field effect transistor (FET) or an insulated-gate bipolar transistor (IGBT)) or a diode structure and may form a part of a first electronic circuit. The second electrical element structure may comprise a transistor (e.g. a field effect transistor (FET) or an insulated-gate bipolar transistor (IGBT)) or a diode structure and may form a part of second electronic circuit, for example. For example, the giant magnetoresistance (GMR) coupler structure may comprise a spiral GMR transmitter and a GMR receiver. The semiconductor device 100 may be a driver integrated circuit (IC), for example.

For example, the first region 120 of the semiconductor substrate 110 may be galvanic isolated from the second region 130 of the semiconductor substrate 110. In this way, a current flow between the first electrical element structure and the second electrical element structure may be avoided. For example, energy and/or information may be exchanged between the first electrical element structure and the second electrical element structure by capacitance, induction or electromagnetic waves, or by optical or acoustic means.

For example, a breakdown voltage of the first electrical element structure and/or a breakdown voltage of the second electrical element structure may be greater than 10V. The semiconductor device 100 may be a power semiconductor device or a semiconductor device comprising different voltage domains, for example. A power semiconductor device or an electrical element structure of the power semiconductor device (e.g. the first electrical element structure or the second electrical element structure) may have a breakdown voltage or blocking voltage of more than 10V (e.g. a breakdown voltage of 10V, 20V or 50V), more than 100V (e.g. a breakdown voltage of 200 V, 300V, 400V or 500V), more than 500V (e.g. a breakdown voltage of 600V, 700V, 800V or 1000V) or more than 1000V (e.g. a breakdown voltage of 1200V, 1500V, 1700V, 2000V, 3300V or 6500V).

For example, different voltages may be provideable to the first region 120 of the semiconductor substrate 110 and the second region 130 of the semiconductor substrate 110. In this way, the first electrical element structure and the second electrical element structure may be operated in different voltage domains. For example, the voltages may be provided by an external control circuit connected to the semiconductor device 100. Alternatively, the semiconductor device 100 may comprise a control circuit for providing the voltages. The control circuit may be implemented at the semiconductor substrate 110, for example.

For example, a first voltage may be provided to the first region 120 of the semiconductor substrate 110 and a second voltage may be provided to the second region 130 of the semiconductor substrate 110. A difference between the first voltage and the second voltage may be greater than 10V (or greater than 100V or greater than 1 kV).

For example, the first electrical element structure and the second electrical element structure may be operated at different ground potentials. For example, a difference between the ground potential of the first electrical element structure and the ground potential of the second electrical element structure may be greater than 100V (or greater than 250V, greater than 500V, or greater than 1 kV) and less than 6 kV (or less than 5 kV or less than 2 kV). The difference between the ground potential of the first electrical element structure and the ground potential of the second electrical element structure may be 1200V, for example.

For example, a vertical direction or a vertical dimension may be measured orthogonal to the front side surface of the semiconductor substrate 110 and a lateral direction or lateral dimensions may be measured in parallel to the front side surface of the semiconductor substrate 110. The front side or front side surface of the semiconductor substrate 110 may be the side used to implement more sophisticated and complex structures than at the backside of the semiconductor substrate 110, since the process parameters (e.g. temperature) and the handling may be limited for the backside, if structures are already formed at one side of the semiconductor substrate 110, for example.

Figure 2:
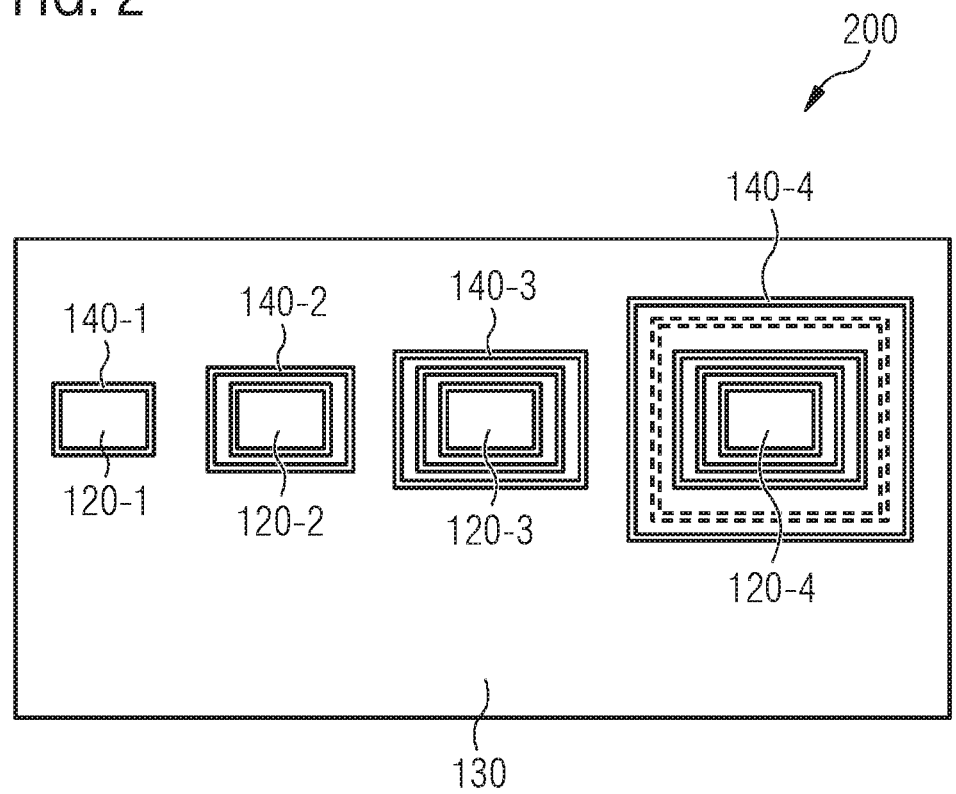
FIG. 2 shows a schematic top view of a part of another semiconductor device.

FIG. 2 shows a schematic top view of a part of another semiconductor device 200. The implementation of the semiconductor device 200 may be similar to the implementation of the semiconductor device described in connection with FIG. 1. The semiconductor device 100 comprises a second region 130 of a semiconductor substrate and four first regions 120 of the semiconductor substrate. The first regions 120 are each laterally electrically insulated from the second region 130 by a respective insulating structure 140. The first region 120-1 may be at a first potential (e.g. potential 1) and the second region 130 may be at a second potential (e.g. potential 2). The insulating structure 140-1 surrounds the first region 120-1. For example, the insulating structure 140-1 may comprise one trench or one deep trench insulation (DTI) structure. For example, the insulating structure 140-1 may comprise one DTI ring. The insulation structure 140-1 may have a (lateral) breakdown voltage (VBD), for example. Additionally, the insulating structure 140-2 surrounds the first region 120-2. For example, the insulating structure 140-2 may comprise two trenches or two DTI structures. For example, the insulating structure 140-2 may comprise two concentric DTI rings. A (lateral) breakdown voltage of the insulation structure 140-2 may be (ca.) twice the (lateral) breakdown voltage of the insulation structure 140-1, for example. Further, the insulating structure 140-3 surrounds the first region 120-3. For example, the insulating structure 140-3 may comprise three trenches or three DTI structures. For example, the insulating structure 140-3 may comprise three concentric DTI rings. A (lateral) breakdown voltage of the insulation structure 140-3 may be (ca.) three times the (lateral) breakdown voltage of the insulation structure 140-1, for example. Additionally, the insulating structure 140-4 surrounds the first region 120-4. For example, the insulating structure 140-4 may comprise n trenches or n DTI structures. For example, the insulating structure 140-4 may comprise n concentric DTI rings. A (lateral) breakdown voltage of the insulation structure 140-4 may be (ca.) n times the (lateral) breakdown voltage of the insulation structure 140-1, for example. FIG. 2 may show the semiconductor device 200 after an intermediate manufacturing step. In a later manufacturing step, a connecting structure 150 may be added to the semiconductor device 200.

FIG. 2 shows an example of voltage scaling by usage of concentric trench rings. For example, some regions may be introduced which may float (e.g. silicon islands between the DTI structures of the insulating structures 140 and/or poly silicon fill of the DTI structures of the insulating structures 140). There may be a desire to control the potentials of the floating regions (e.g. of floating areas).

For example, the semiconductor device 200 may have a high voltage (HV) insulation (e.g. up to some kV). As an insulation scheme junction isolations or dielectric features (e.g. thick dielectrics) or even mixing of both may be used. For example, the semiconductor device 200 may form or may be an element of a gate driver chip to utilize control of several power devices by a single chip which may therefore include several regions on chip with HV capability. To define a HV or HC capable region of the semiconductor substrate 110 (e.g. of a wafer) a dielectric isolation in vertical and lateral directions may be provided, for example. Towards lateral (e.g. towards lateral direction) this may be implemented with silicon on insulator (SOI) technology, for example. A buried oxide (BOX) thickness may be defined by a desired voltage capability of the chip, for example. For example, lateral insulation may be implemented by single trench or by multiple trenches (e.g. utilizing already an existing trench, capable of less than the desired HV). Scaling of HV capability may be introduced by stacking DTI structures to reach desired requirements, for example.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIG. 3-10).

Figure 3:
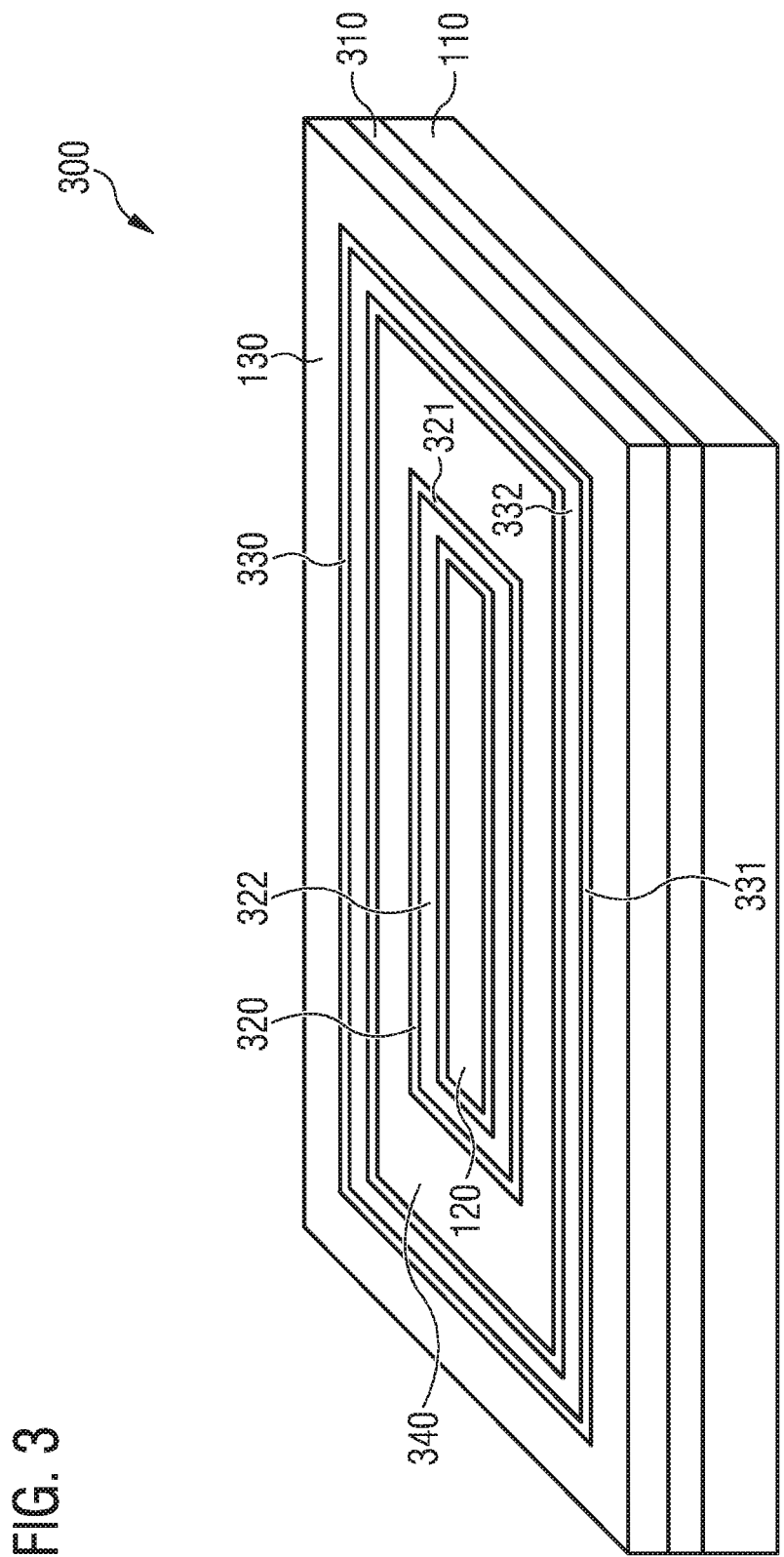
FIG. 3 shows a schematic perspective view of a part of another semiconductor device.

FIG. 3 shows a schematic perspective view of a part of another semiconductor device 300. The implementation of the semiconductor device 300 may be similar to the implementation of the semiconductor device described in connection with FIG. 1. The semiconductor device 300 comprises a semiconductor substrate 110 having a first region 120 and a second region 130. The semiconductor substrate 110 further comprises a buried insulation layer 310. Further, the semiconductor device 300 comprises a first trench 320 and a second trench 330. A third region 340 of the semiconductor substrate 110 is located between the first trench 320 and the second trench 330. The first trench 320, the second trench 330 and the third region 340 form an insulating structure 140. Additionally, the third region 340 may form an intermediate potential region (e.g. an isolated/floating region). For example, the third region 340 may comprise silicon. The first trench 320 comprises an insulating material 321 and an electrically conducting material 322 (e.g. a poly silicon fill of the first trench 320). The electrically conducting material 322 may form an intermediate potential region (e.g. an isolated/floating region). Additionally, the second trench 330 comprises an insulating material 331 and an electrically conducting material 332 (e.g. a poly silicon fill of the second trench 330). The electrically conducting material 332 may form an intermediate potential region (e.g. an isolated/floating region). Further, the first trench 320 and the second trench 330 may each form a trench ring laterally surrounding the first region 120. FIG. 3 may show the semiconductor device 300 after an intermediate manufacturing step. In a later manufacturing step, a connecting structure 150 may be added to the semiconductor device 300.

FIG. 3 shows an example with two trench rings. For example, the trench rings may define isolated/floating regions comprising silicon and/or poly silicon fill.

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIG. 1-2) or below (e.g. FIG. 4-10).

Figure 4:
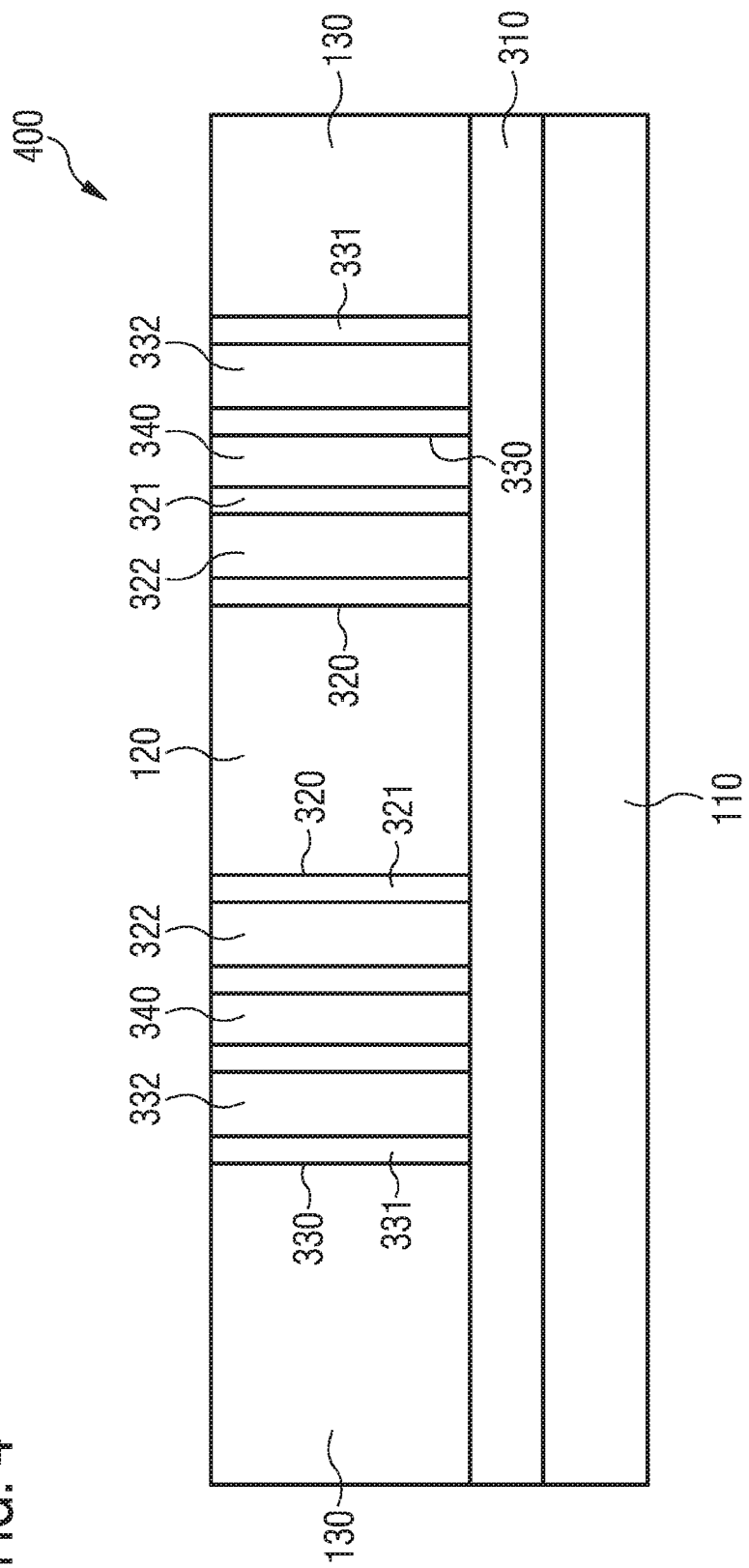
FIG. 4 shows a schematic cross section of a part of another semiconductor device.

FIG. 4 shows a schematic cross section of a part of another semiconductor device 400. The implementation of the semiconductor device 400 may be similar to the implementation of the semiconductor device described in connection with FIG. 1. The semiconductor device 400 comprises a semiconductor substrate 110 having a first region 120, a second region 130 and a third region 340. For example, the semiconductor substrate 110 and/or the second region 130 may comprise silicon. The semiconductor substrate 110 further comprises a buried insulation layer 310. For example, the buried insulation layer 310 comprises an oxide (e.g. silicon oxide) or aluminum nitride. The buried insulation layer 310 may be a buried dielectric, for example. Further, the semiconductor device 400 comprises a first trench 320 and a second trench 330. The first trench 320, the second trench 330 and the third region 340 form an insulating structure 140. The second region 130, the third region 340, the first trench 320 and the second trench 330 laterally surround the first region 120. Further, the first trench 320 comprises an insulating material 321 (e.g. a dielectric or an oxide) and an electrically conducting material 322 (e.g. a conducting fill or a poly silicon fill of the first trench 320). Additionally, the second trench 330 comprises an insulating material 331 (e.g. a dielectric or an oxide) and an electrically conducting material 332 (e.g. a conducting fill or a poly silicon fill of the second trench 330). For example, the third region 340, the electrically conducting material 322 and electrically conducting material 332 may form intermediate potential regions (e.g. floating regions). The first region 120 may be at a first potential (e.g. potential 2) and the second region 130 may be at a second potential (e.g. potential 1), for example. FIG. 4 may show the semiconductor device 400 after an intermediate manufacturing step. In a later manufacturing step, a connecting structure 150 may be added to the semiconductor device 400.

FIG. 4 shows an example with two trench rings. A voltage V applied (e.g. to the insulating structure 140) may be given by a difference between the second potential and the first potential: V=potential 1−potential 2.

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIG. 1-3) or below (e.g. FIG. 5-10).

Figure 5:
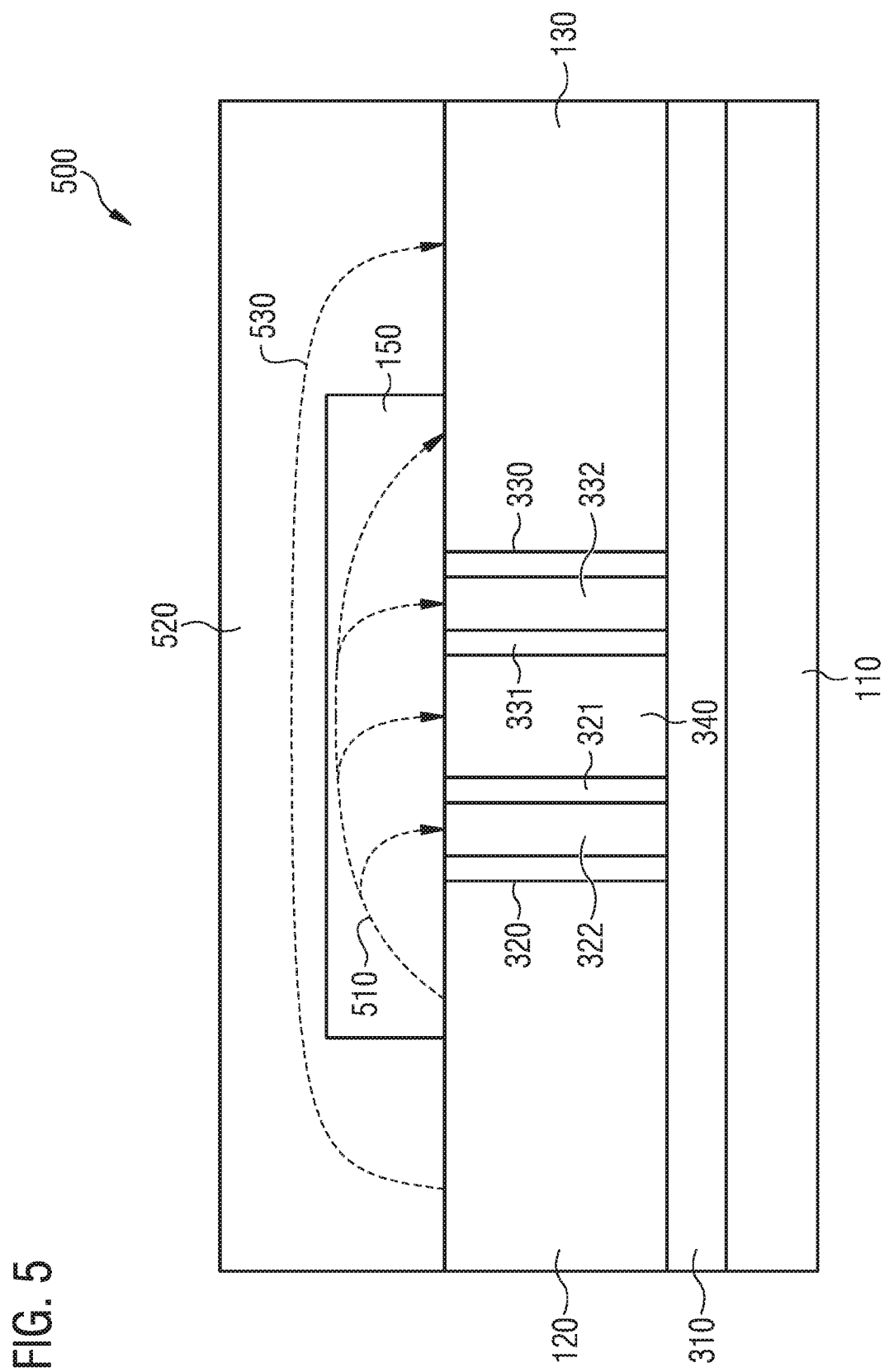
FIG. 5 shows a schematic cross section of a part of another semiconductor device.

FIG. 5 shows a schematic cross section of a part of another semiconductor device 500. The implementation of the semiconductor device 500 may be similar to the implementation of the semiconductor device described in connection with FIG. 1. The semiconductor device 500 comprises a semiconductor substrate 110 having a first region 120, a second region 130 and a third region 340. For example, the semiconductor substrate 110 and/or the second region 130 may comprise silicon. The semiconductor substrate 110 further comprises a buried insulation layer 310. For example, the buried insulation layer 310 comprises an oxide (e.g. silicon oxide) or aluminum nitride. The buried insulation layer 310 may be a buried dielectric, for example. Further, the semiconductor device 500 comprises a first trench 320 and a second trench 330. The first trench 320, the second trench 330 and the third region 340 form an insulating structure 140. Further, the first trench 320 comprises an insulating material 321 and an electrically conducting material 322. Additionally, the second trench 330 comprises an insulating material 331 and an electrically conducting material 332. The semiconductor device 500 further comprises a connecting structure 150 (e.g. a DLC layer). The connecting structure 150 is electrically connected with the first region 120, the electrically conducting material 322 within the first trench 320, the third region 340, the electrically conducting material 332 within the second trench 330 and the second region 320. For example, the first region 120 may be at a first potential (e.g. potential 2) and the second region 130 may be at a second potential (e.g. potential 1). Electrical currents may flow (e.g. due to the different potentials of the first region 120 and the second region 130) from the first region 120 to the electrically conducting material 322 within the first trench 320, to the third region 340, to the electrically conducting material 332 within the second trench 330 and to the second region 320 via the connecting structure 150 as indicated by arrows 510. Additionally, the semiconductor device 500 comprises a dielectric structure 520 located adjacent to the first region 120, the second region 130 and the connecting structure 150. For example, the dielectric structure 520 may comprise an oxide (e.g. silicon oxide), borophosphosilicate glass and/or a back end of line (BEOL) dielectric. A current may flow (e.g. due to the different potentials of the first region 120 and the second region 130) from the first region 120 to the second region 130 via the dielectric structure 520 as indicated by an arrow 530. For example, an amplitude of the current through the dielectric structure 520 may be less than an amplitude of the current through the connecting structure 140. A leakage of the connecting structure 150 (e.g. a leakage I high) may be greater than a leakage of the dielectric structure 520 (e.g. a leakage I low), for example.

FIG. 5 shows an example of implementing a layer with increased leakage, which may define potentials. For example, the connecting structure 150 may have an increased leakage compared to the dielectric structure 520 (e.g. BPSG or an oxide of BEOL). The connecting structure 150 may comprise a nitride (e.g. silicon nitride) and/or diamond like carbon (DLC).

For example, to clamp the intermediate potential regions or the floating regions on a defined potential the connecting structure 150 (e.g. a leaky dielectric layer) may be introduced above the first trench 320 and the second trench 330 (e.g. above high voltage (HV) trench rings). A leakage current introduced by the connecting structure 150 (e.g. the layer) may be higher than any surrounding dielectric (e.g. a leakage current of any surrounding dielectric), so it may define the potentials.

For example, for the connecting structure 150 diamond like carbon (DLC), as well as hydrogenated silicon carbide (SiC—H), as well as silicon nitride ($Si_3N_4$), or any layer with greater or increased leakage current than silicon oxide ($SiO_2$) may be used.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIG. 1-4) or below (e.g. FIG. 6-10).

Figure 6:
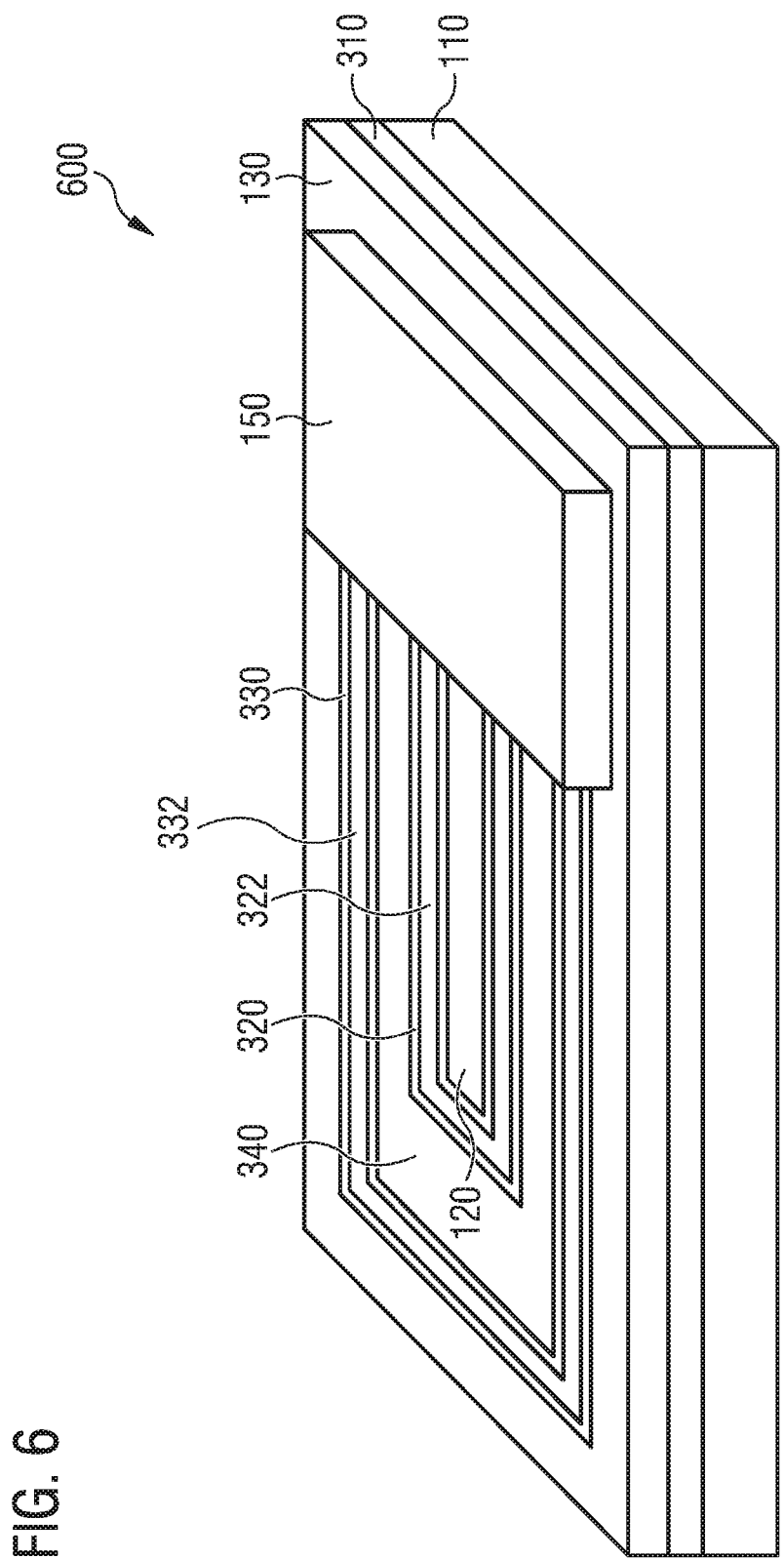
FIG. 6 shows a schematic perspective view of a part of another semiconductor device.

FIG. 6 shows a schematic perspective view of a part of another semiconductor device 600.

The implementation of the semiconductor device 600 may be similar to the implementation of the semiconductor device described in connection with FIG. 3. The semiconductor device 600 differs from the semiconductor device described in connection with FIG. 3 by a connecting structure 150 (e.g. DLC or a DLC layer). The connecting structure 150 is located at a surface (e.g. at a front side surface) of the semiconductor substrate 110 and covers a portion of the surface of the semiconductor substrate 110. Thereby, the connecting structure 150 is in contact with the first region 120, the second region 130, the third region 340, the first trench 320, and the second trench 330. The third region 340, the electrically conducting material 322 within the first trench 320 and the electrically conducting material 332 within the second trench 330 may form intermediate potential regions, for example. For example, the connecting structure 150 may be a diamond like carbon (DLC) layer.

FIG. 6 shows an example with a DLC layer (e.g. the connecting structure 150). For example, floating regions (e.g. the intermediate potential regions) may be resistive coupled to potentials applied.

More details and aspects are mentioned in connection with the embodiments described above or below. The embodiment show n in FIG. 6 may comprise one or more optional additional features corresponding to one or more aspects mentioned in connection with the proposed concept or one or more embodiments described above (e.g. FIG. 1-5) or below (e.g. FIG. 7-10).

Figure 7:
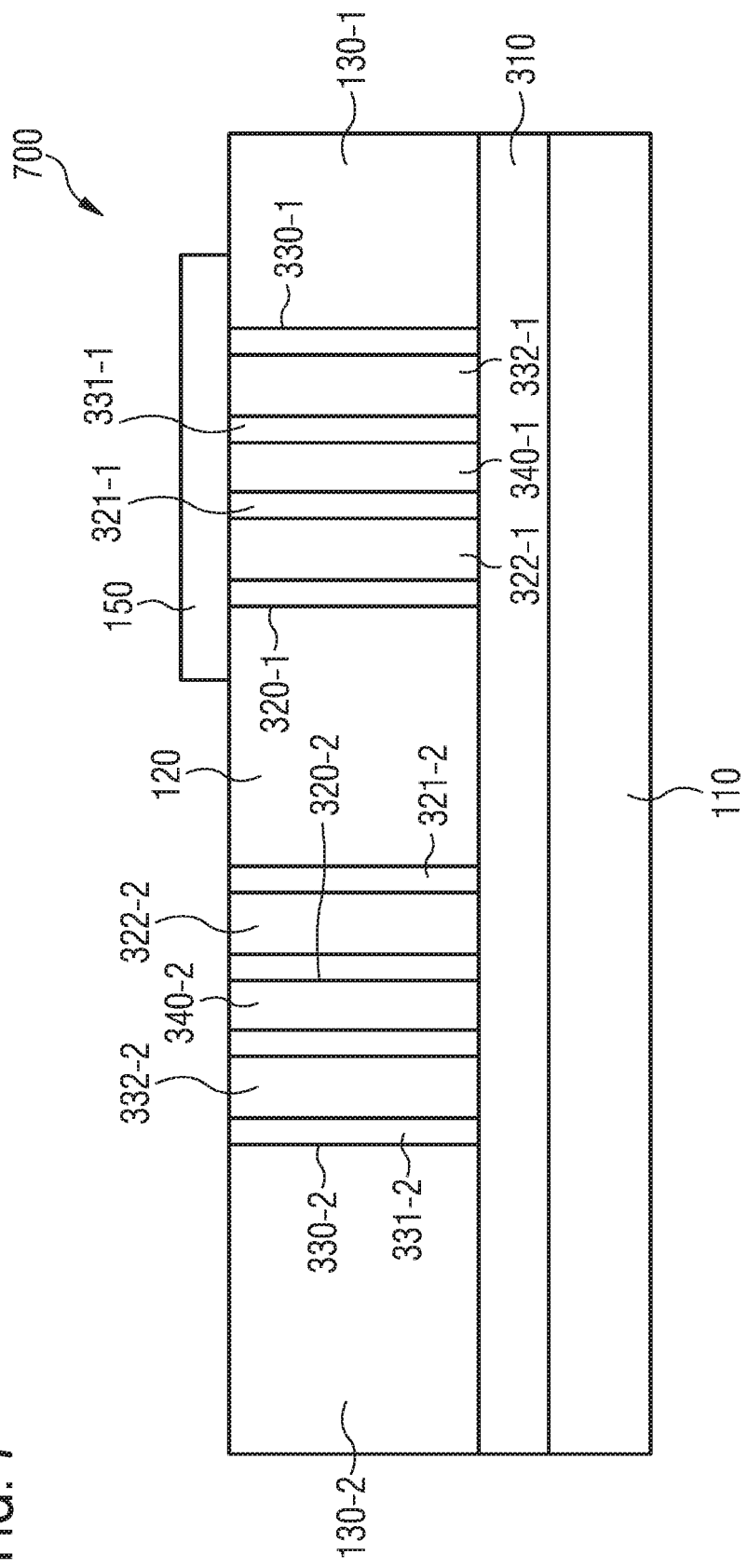
FIG. 7 shows a schematic cross section of a part of another semiconductor device.

FIG. 7 shows a schematic cross section of a part of another semiconductor device 700. The implementation of the semiconductor device 700 may be similar to the implementation of the semiconductor device described in connection with FIG. 4. The semiconductor device 700 differs from the semiconductor device described in connection with FIG. 4 by a connecting structure 150 (e.g. a DLC layer). The connecting structure 150 is located at a surface (e.g. at a front side surface) of the semiconductor substrate 110 and covers a portion of the surface of the semiconductor substrate 110. Thereby, the connecting structure 150 is in contact with the first region 120, the second region 130-1, the third region 340-1, the first trench 320-1, and the second trench 330-1. The third region 340-1, the electrically conducting material 322-1 within the first trench 320-1 and the electrically conducting material 332-1 within the second trench 330-1 may form intermediate potential regions, for example. For example, the connecting structure 150 may be a diamond like carbon (DLC) layer. The first region 120 may be at a first potential (e.g. potential 2) and the second region 130 may be at a second potential (e.g. potential 1), for example.

FIG. 7 shows an example with a DLC layer (e.g. the connecting structure 150). A voltage V applied (e.g. to the insulating structure 140) may be given by a difference between the second potential and the first potential: V=potential 1−potential 2.

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIG. 1-6) or below (e.g. FIG. 8-10).

Figure 8:
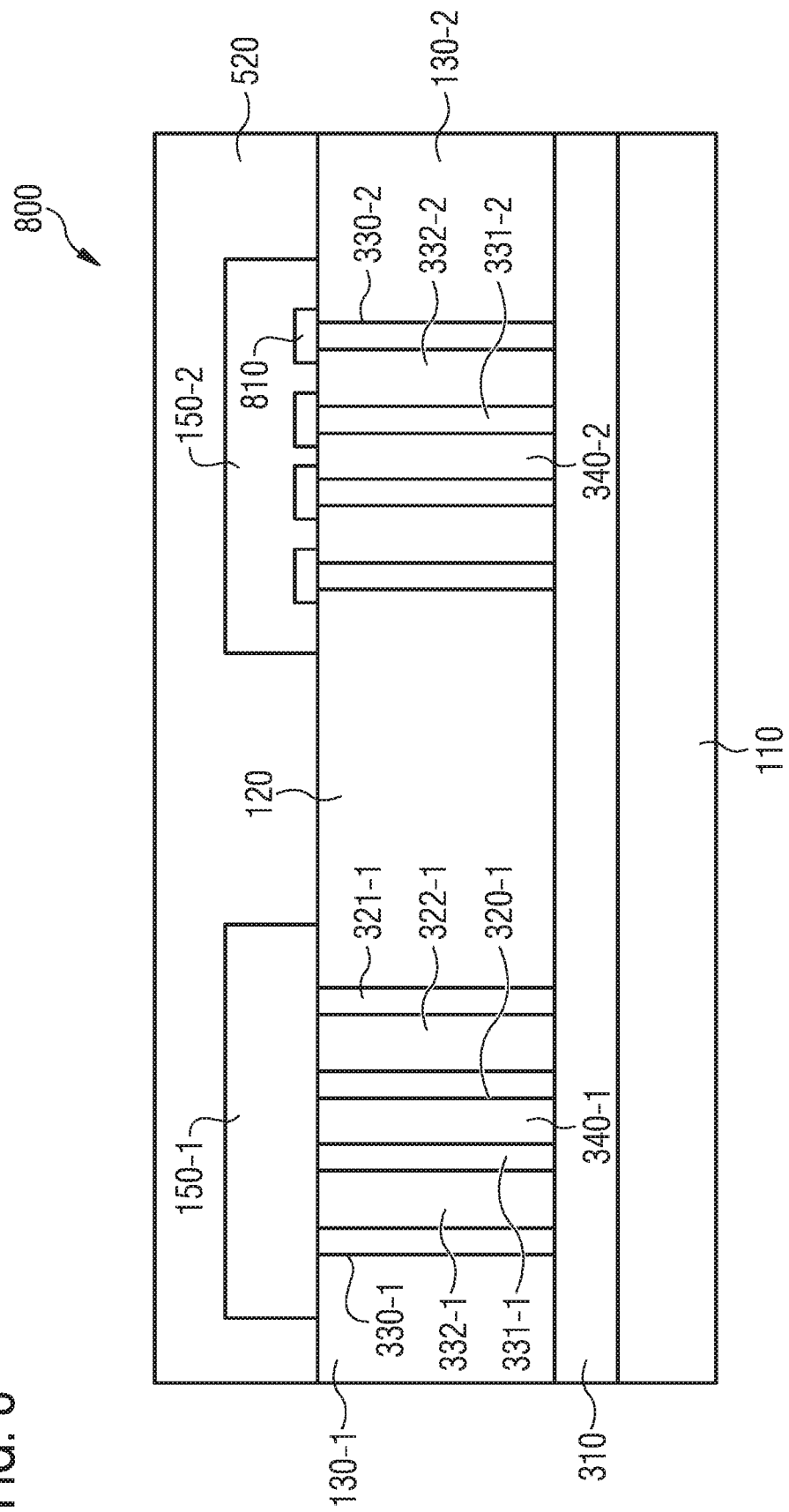
FIG. 8 shows a schematic cross section of a part of another semiconductor device.

FIG. 8 shows a schematic cross section of a part of another semiconductor device 800. The implementation of the semiconductor device 800 may be similar to the implementation of the semiconductor device described in connection with FIG. 1. The semiconductor device 800 comprises a semiconductor substrate 110 having a first region 120, two second regions 130 and two third regions 340. For example, the semiconductor substrate 110 and/or the second region 130-2 may comprise silicon. The semiconductor substrate 110 further comprises a buried insulation layer 310. For example, the buried insulation layer 310 comprises an oxide (e.g. silicon oxide) or aluminum nitride. The buried insulation layer 310 may be a buried dielectric, for example. Further, the semiconductor device 800 comprises two first trenches 320 and two second trenches 330. The first trenches 320, the second trenches 330 and the third regions 340 form insulating structures 140. Further, the first trenches 320 each comprises an insulating material 321 and an electrically conducting material 322. Additionally, the second trenches 330 each comprise an insulating material 331 and an electrically conducting material 332. The first trenches 120, the second trenches 130 and the third region 340 may form a deep trench insulation (DTI) structure.

The semiconductor device 500 further comprises two connecting structures 150 (e.g. DLC layers). The connecting structure 150-1 is located adjacent to the first region 120, the first trench 320-1, the third region 340-1, the second trench 330-1 and the second region 320-1. Further, the connecting structure 150-1 is in contact with the insulating material 321-1 and the electrically conducting material 322-1 within the first trench 320-1 and in contact with the insulating material 331-1 and the electrically conducting material 332-1 within the second trench 330-1. The connecting structure 150-2 is located adjacent to the first region 120, the first trench 320-2, the third region 340-2, the second trench 330-2 and the second region 320-2. Further, the connecting structure 150-2 is in contact with the electrically conducting material 322-2 within the first trench 320-2 and in contact with the electrically conducting material 332-2 within the second trench 330-2. The connecting structure 150-2 is electrically insulated from the insulating material 321-2 within the first trench 320-2 and from the insulating material 331-3 within the second trench 330-2 by contact holes 810. The contact holes 810 may comprise an oxide (e.g. silicon oxide), borophosphosilicate glass and/or a BEOL dielectric.

Additionally, the semiconductor device 800 comprises a dielectric structure 520 located adjacent to the first region 120, the second regions 130 and the connecting structures 150. For example, the dielectric structure 520 may comprise an oxide (e.g. silicon oxide), borophosphosilicate glass and/or a BEOL dielectric.

FIG. 8 shows an example of versions of contacting. For example, the connecting structure 150-1 (e.g. a DLC) may be fully contacting all regions. e.g. silicon, poly (e.g. poly silicon) and oxide of the DTI structure. For example, the connecting structure 150-2 (e.g. a DLC) may be only contacting conducting regions, e.g. silicon and poly (e.g. poly silicon), (no oxide contact). For example, optionally the connecting structure 150 (e.g. a contact) may be flat on all surfaces or defined by the contact holes 810 in an oxide.

More details and aspects are mentioned in connection with the embodiments described above or below. The embodiment shown in FIG. 8 may comprise one or more optional additional features corresponding to one or more aspects mentioned in connection with the proposed concept or one or more embodiments described above (e.g. FIG. 1-7) or below (e.g. FIG. 9-10).

Figure 9:
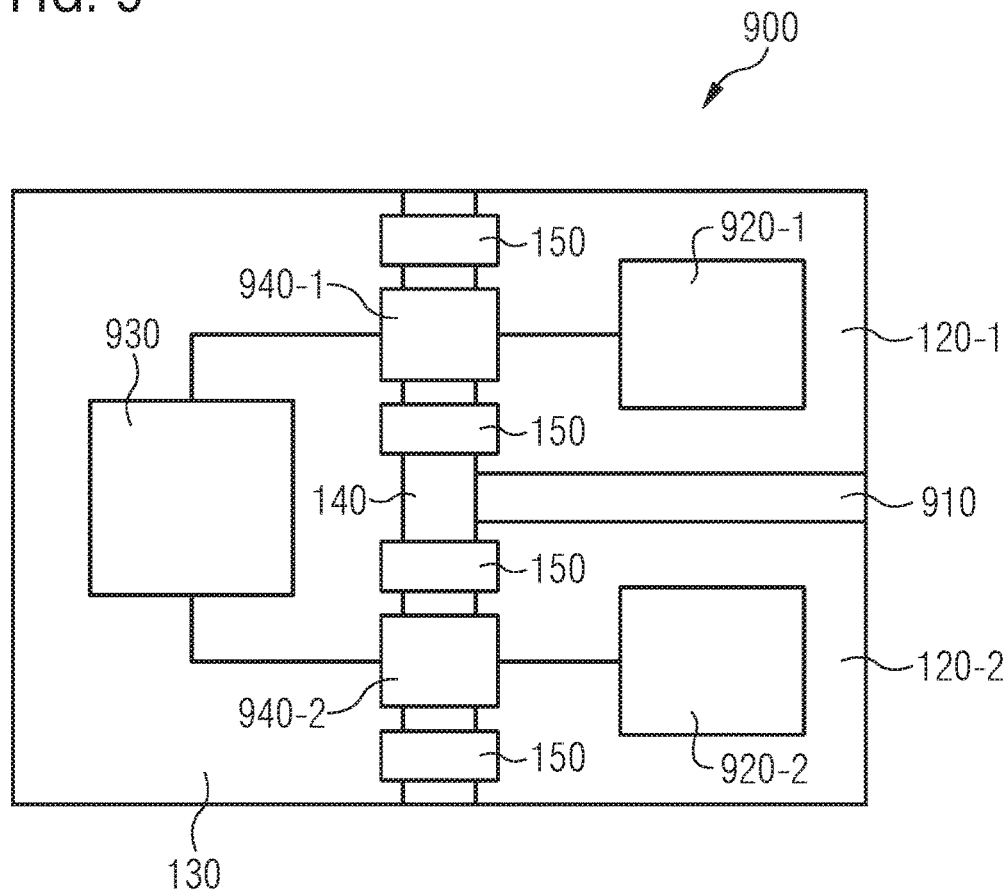
FIG. 9 shows a schematic block diagram of a part of another semiconductor device.

FIG. 9 shows a schematic block diagram of a part of another semiconductor device 900. The implementation of the semiconductor device 900 may be similar to the implementation of the semiconductor device described in connection with FIG. 1. The semiconductor device 900 comprises a semiconductor substrate having two first regions 120 and a second region 130. The first regions 120 are laterally electrically insulated from the second region 130 by an insulating structure 140. Additionally, the first regions 120 are laterally electrically insulated from one another by a further insulating structure 910. The further insulating structure 910 may be implemented similar to the insulating structure 140, for example. Additionally, four connecting structures 150 are located at a surface of the semiconductor substrate. The connecting structures 150 are each in contact with at least a portion of the insulating structure 140 and with one of the first regions 120 and the second region 130. Optionally, a further connecting structure being in contact with at least a portion of the further insulating structure 910 and with both first regions 120 may be provided at the surface of the semiconductor substrate. The further connecting structure may be implemented similar to the connecting structure 150, for example.

In each of the first regions 120 a first electronic circuit 920 comprising a first electrical element structure is located. Further, a second electronic circuit 930 comprising a second electrical element structure is located in the second region 130. The first electronic circuits 920 may be galvanic isolated from the second electronic circuit 930, for example. Additionally, the semiconductor device 900 comprises two giant magnetoresistance (GMR) coupler structures 940. The first electronic circuit 920-1 is connected to the second electronic circuit 930 via the GMR coupler structure 940-1 and the first electronic circuit 920-2 is connected to the second electronic circuit 930 via the GMR coupler structure 940-2. Thereby, the first electrical element structures of the first electronic circuits 920 may be connected to the second electrical element structure of the second electronic circuit 930 via the GMR coupler structures 940.

For example, an operation of the first electronic circuits 920 may be controlled by the second electronic circuit 930. A processor or a microcontroller may be connected to the second electronic circuit 930 and a respective high voltage device or a respective high power device (e.g. an electronic motor or a power switch) may be connected to each of the first electronic circuits 920, for example. The processor or the microcontroller may control an operation of the respective high voltage devices or the respective high power devices by means of the semiconductor device 900. For example, the semiconductor device 900 may form or may be an element of a driver device, a gate driver device or a driver integrated circuit (IC). The semiconductor device 900 may form or may be an element of a driver device for an electronic motor, a battery charger device, a solar inverter device, a switched-mode power supply (SMPS), an uninterruptible power supply (UPS), a welding device and/or an induction cooking device.

More details and aspects are mentioned in connection with the embodiments described above or below. The embodiment shown in FIG. 9 may comprise one or more optional additional features corresponding to one or more aspects mentioned in connection with the proposed concept or one or more embodiments described above (e.g. FIG. 1-8) or below (e.g. FIG. 10).

Figure 10:
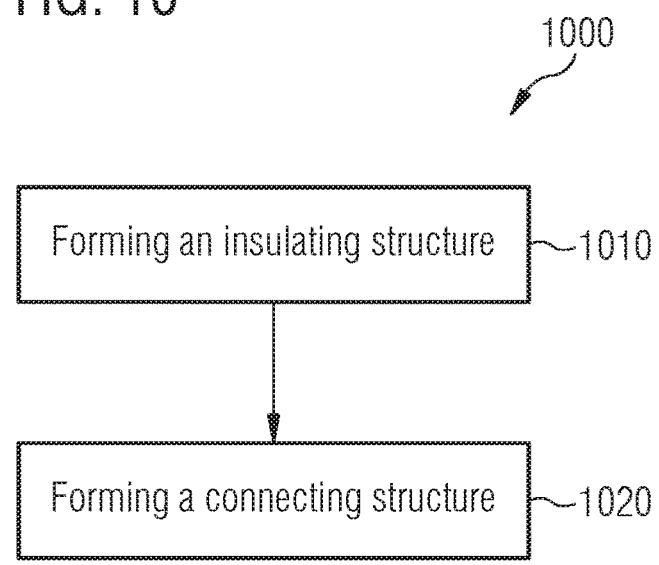
FIG. 10 shows a flow chart of a method for forming a semiconductor device.

FIG. 10 shows a flow chart of a method 1000 for forming a semiconductor device. The method comprises forming 1010 an insulating structure 140 located laterally between a first region 120 and a second region 130 of a semiconductor substrate 110 in the semiconductor substrate 110. The insulating structure 140 electrically insulates the first region 120 laterally from the second region 130 in the semiconductor substrate 110. Additionally, the method 1000 comprises forming 1020 a connecting structure 150 located at a surface of the semiconductor substrate 110. The connecting structure 150 is in contact with at least a sub-structure of the insulating structure 140 and with at least one of the first region 120 and the second region 130. Additionally, at least a sub-structure of the connecting structure 150 has an electrical resistivity greater than $1*10^3$ Ωm (or greater than $1*10^4$ Ωm, greater than $1*10^5$ Ωm, or greater than $1*10^6$ Ωm) and less than $1*10^{12}$ Ωm (or less than $1*10^{11}$ Ωm, less than $1*10^{10}$ Ωm, less than $1*10^9$ Ωm, or less than $1*10^8$ Ωm).

In this way, a semiconductor device comprising a semiconductor substrate 110 having an improved lateral electrical insulation between a first region 120 and a second region 130 of the semiconductor substrate 110 may be formed. By this, a semiconductor device having an improved electrical insulation may be formed.

For example, forming 1010 of the insulating structure 140 may comprise etching a first trench 320 into the semiconductor substrate 100. The etched first trench 320 may be at least partially filled with an insulating material 321 (e.g. silicon oxide) and an electrical conducting material 322 (e.g. poly silicon), for example. For example, the first trench 320 may laterally surround the first region 120. Optionally, forming 1010 of the insulating structure 140 may comprise forming a plurality of trenches in the semiconductor substrate 110 at an interface between the first region 120 and the second region 130. The trenches of the plurality of trenches may be implemented similar to the first trench 320, for example.

For example, forming 1020 of the connecting structure 150 may comprise depositing a diamond like carbon layer, a hydrogenated silicon carbide layer, or a silicon nitride layer at the surface of the semiconductor substrate 110 and structuring the deposited diamond like carbon layer, the deposited hydrogenated silicon carbide layer, or the deposited silicon nitride layer.

For example, the method 1000 may further comprise bonding of a donor semiconductor substrate to a base semiconductor substrate and horizontally splitting of the bonded donor semiconductor substrate to form the semiconductor substrate 110 and a further donor substrate. An insulating layer (e.g. a silicon oxide layer) may be formed at a surface of the donor semiconductor substrate or at all surfaces of the donor semiconductor substrate prior to bonding of the donor semiconductor substrate to the base semiconductor substrate (e.g. a silicon based substrate). In this way, a silicon on insulator substrate may be provided as the semiconductor substrate 110.

More details and aspects are mentioned in connection with the embodiments described above or below. The embodiment shown in FIG. 10 may comprise one or more optional additional features corresponding to one or more aspects mentioned in connection with the proposed concept or one or more embodiments described above (e.g. FIG. 1-9) or below.

Some embodiments relate to defining potentials of floating regions by utilizing a defined dielectric layer.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate comprising a first region and a second region;
an insulating structure laterally between the first region and the second region in the semiconductor substrate, the insulating structure electrically insulating the first region laterally from the second region in the semiconductor substrate;
a connecting structure at a surface of the semiconductor substrate, the connecting structure contacting at least a sub-structure of the insulating structure and at least one of the first region and the second region; and
a dielectric structure adjacent to the first region, the second region and the connecting structure,
wherein at least a sub-structure of the connecting structure has an electrical resistivity greater than $1*10^3$ Ωm and less than $1*10^{12}$ Ωm,
wherein the sub-structure of the insulating structure is electrically connected to at least one of the first region and the second region via the connecting structure, so that a potential of the insulating structure is controllable, and so that a potential difference between the insulating structure and the first region and/or a potential difference between the insulating structure and the second region is controllable,
wherein due to different potentials of the first region and the second region, a current flows from the first region to the second region via the dielectric structure,
wherein a leakage of the connecting structure is greater than a leakage of the dielectric structure.

2. The semiconductor device of claim 1, wherein the sub-structure of the connecting structure is at least one of a metal oxide structure, a metal nitride structure, a diamond structure, a diamond like structure, a diamond like carbon structure, a silicon carbide structure, a silicon carbide like structure, a hydrogenated silicon carbide structure, a silicon oxide structure, and a silicon nitride structure.

3. The semiconductor device of claim 1, wherein the connecting structure is in contact with the first region of the semiconductor substrate and the second region of the semiconductor substrate.

4. The semiconductor device of claim 1, wherein the sub-structure of the insulating structure includes an intermediate potential region comprising at least one of an electrical conducting material and a semiconductor material.

5. The semiconductor device of claim 1, wherein the insulating structure comprises a first trench extending from the surface of the semiconductor substrate into the semiconductor substrate, wherein the sub-structure of the insulating structure comprises an intermediate potential region within the first trench, wherein insulating material is arranged between a wall of the first trench and the intermediate potential region, and wherein the intermediate potential region contacts the sub-structure of the connecting structure.

6. The semiconductor device of claim 1, wherein the insulating structure comprises a first trench and a second trench extending from the surface of the semiconductor substrate into the semiconductor substrate, wherein the first trench and the second trench are each at least partially filled with an insulating material, wherein the first trench electrically insulates a third region of the semiconductor substrate laterally from the first region of the semiconductor substrate, wherein the second trench electrically insulates the third region of the semiconductor substrate laterally from the second region of the semiconductor substrate, and wherein the sub-structure of the insulating structure is implemented by the third region of the semiconductor substrate.

7. The semiconductor device of claim 1, further comprising a buried insulation layer within the semiconductor substrate, wherein the buried insulation layer electrically insulates at least one of the first region and the second region vertically from a bulk of the semiconductor substrate.

8. The semiconductor device of claim 7, wherein the buried insulation layer comprises at least one of silicon oxide and aluminum nitride.

9. The semiconductor device of claim 7, wherein the insulating structure vertically extends from the surface of the semiconductor substrate to the buried insulation layer.

10. The semiconductor device of claim 1, wherein the insulating structure laterally surrounds the first region of the semiconductor substrate.

11. The semiconductor device of claim 1, wherein the second region of the semiconductor substrate laterally surrounds the first region of the semiconductor substrate.

12. The semiconductor device of claim 1, wherein the second region of the semiconductor substrate laterally surrounds the insulating structure.

13. The semiconductor device of claim 1, wherein the connecting structure comprises solely material having an electrical resistivity of less than $1*10^{12}$ Ωm.

14. The semiconductor device of claim 1, wherein the connecting structure is a layer formed directly at the surface of the semiconductor substrate.

15. The semiconductor device of claim 1, wherein the semiconductor substrate is a semiconductor on insulator substrate.

16. The semiconductor device of claim 1, wherein a first electrical element structure is located at least partially within the first region of the semiconductor substrate, wherein a second electrical element structure is located at least partially within the second region of the semiconductor substrate, and wherein the first electrical element structure and the second electrical element structure are connected via a giant magnetoresistance coupler structure.

17. The semiconductor device of claim 1, wherein the first region of the semiconductor substrate is galvanically isolated from the second region of the semiconductor substrate.

18. The semiconductor device of claim 1, wherein a breakdown voltage of a first electrical element structure implemented at the first region of the semiconductor substrate is greater than 10V.

19. The semiconductor device of claim 1, wherein the first region of the semiconductor substrate and the second region of the semiconductor substrate are configured to receive different voltages.

20. The semiconductor device of claim 1, wherein an amplitude of the current through the dielectric structure is less than an amplitude of a current through the connecting structure.

21. A method for forming a semiconductor device, the method comprising:
   forming an insulating structure laterally between a first region and a second region of a semiconductor substrate, the insulating structure electrically insulating the first region laterally from the second region in the semiconductor substrate;
   forming a connecting structure at a surface of the semiconductor substrate, the connecting structure contacting at least a sub-structure of the insulating structure and at least one of the first region and the second region of the semiconductor substrate, wherein at least a sub-structure of the connecting structure has an electrical resistivity greater than $1*10^3$ Ωm and less than $1*10^{12}$ Ωm;
   electrically connecting the sub-structure of the insulating structure to at least one of the first region and the second region via the connecting structure, so that a potential of the insulating structure is controllable, and so that a potential difference between the insulating structure and the first region and/or a potential difference between the insulating structure and the second region is controllable; and
   forming a dielectric structure adjacent to the first region, the second region and the connecting structure,
   wherein due to different potentials of the first region and the second region, a current flows from the first region to the second region via the dielectric structure,
   wherein a leakage of the connecting structure is greater than a leakage of the dielectric structure.

* * * * *